United States Patent [19]

Matloubian et al.

[11] Patent Number: 5,663,583

[45] Date of Patent: Sep. 2, 1997

[54] LOW-NOISE AND POWER ALGAPSB/GAINAS HEMTS AND PSEUDOMORPOHIC HEMTS ON GAAS SUBSTRATE

[75] Inventors: Mehran Matloubian, Encino; Takyiu Liu; Chanh Nguyen, both of Newbury Park, all of Calif.

[73] Assignee: Hughes Aircraft Company, Los Angeles, Calif.

[21] Appl. No.: 466,157

[22] Filed: Jun. 6, 1995

[51] Int. Cl.⁶ .................. H01L 31/0328; H01L 21/20
[52] U.S. Cl. .................. 257/192; 257/194; 257/613; 438/172; 148/33.4; 117/89
[58] Field of Search .................. 257/192, 194, 257/201, 613, 190, 200; 437/126, 133, 40

[56] References Cited

U.S. PATENT DOCUMENTS 5,430,310 7/1995 Shibasaki et al. .................. 257/194

FOREIGN PATENT DOCUMENTS 0 531 550 A1 3/1992 European Pat. Off. .
0 602 671 A3 12/1993 European Pat. Off. .
2-005438 3/1990 Japan .

OTHER PUBLICATIONS

Chris G. Van de Walle, "Band Lineups and Deformation Potentials in the Model–Solid Theory", Am. Phys. Soc., Phys. Rev. B., vol. 39, No. 3, Jan., 1989.

*Primary Examiner*—Mark V. Prenty
*Attorney, Agent, or Firm*—V. D. Duraiswamy; W. K. Denson-Low

[57] ABSTRACT

An epitaxial structure and method of manufacture for a field-effect transistor capable of low-noise and power applications. Preferably, the epitaxial structure includes an N-type barrier layer comprising a wide-gap semiconductor material having the formula $Al_{1-y}Ga_yP_{0.71+z}Sb_{0.29-z}$.

32 Claims, 1 Drawing Sheet

LOW-NOISE AND POWER ALGAPSB/ GAINAS HEMTS AND PSEUDOMORPOHIC HEMTS ON GAAS SUBSTRATE

BACKGROUND OF THE INVENTION

1. Field of the Invention

The present invention relates in general to the manufacture of a field-effect transistor epitaxial structure. More particularly, the present invention relates to a novel material system and epitaxial structure for a modulation-doped field-effect transistor (MODFET) or lattice-matched and pseudomorphic high electron mobility transistors (HEMTs and pHEMTs).

2. Description of the Related Art

A MODFET is a field-effect semiconductor transistor designed to allow electron flow to occur in an undoped channel layer so that the electron mobility is not limited by impurity scattering. MODFETs are used in a variety of electronic devices such as solid-state power amplifiers, low-noise amplifiers as well as satellite receivers and transmitters, advanced radar and fiber-optics operating in microwave and millimeter wave systems.

A conventional MODFET includes a GaAs substrate, a buffer layer, a channel layer, a spacer layer, a donor layer, a barrier layer (also known as a Schottky layer) and a cap layer formed on the substrate. The barrier layer may be doped to function as both the Schottky barrier layer as well as the donor layer. The spacer, donor and barrier layers are typically formed of a wide bandgap semiconductor material such as aluminum gallium arsenide (AlGaAs). The channel and cap layers are formed of a narrow bandgap semiconductor material such as gallium arsenide (GaAs) or gallium indium arsenide (GaInAs).

A lattice-matched high electron mobility transistor (HEMT) is a type of MODFET, having a narrow-gap semiconductor material lattice-matched to the wide-gap semiconductor material. A pseudomorphic high electron mobility transistor (pHEMT) is another type of MODFET in which the narrow-gap semiconductor material is not lattice-matched to the wide-gap semiconductor material. For example, a conventional pHEMT based on the $Al_aGa_{1-a}As/Ga_xIn_{1-x}As$ material system has a typical profile employing a=0.3 in the donor layer and x=0.2 in the channel layer.

In these devices, discontinuity in the energy gaps between the wide-gap semiconductor donor layer and the narrow-gap semiconductor channel layer causes electrons to remain in the channel layer, but very close to the heterojunction because of the electrostatic attraction from the donor atoms. Conduction of electrons therefore takes place in an undoped channel layer so that the electron mobility is not limited by impurity scattering.

Manufacturers have attempted to create HEMT devices having a channel layer with a large sheet charge density which result in devices with higher current-carrying capabilities. Increasing the conduction band discontinuity (ΔEc) between the donor layer and the channel layer increases the sheet charge concentration in the channel layer of a conventional pHEMT based on the $Al_aGa_{1-a}As/Ga_xIn_{1-x}As$ material system. However, increasing the Al percentage compromises the reliability of the device. In addition, a high-Al AlGaAs can also be chemically unstable.

Furthermore, for power transistor applications, it is desirable to decrease the hole injection from the channel layer into the barrier layer, thus increasing the gate-drain breakdown voltage and reducing the gate current. A high valence band discontinuity (ΔEv) between the channel layer and the barrier layer reduces the hole injection into the barrier layer. Conventional devices often employ a double gate recess construction to obtain a high gate-drain breakdown voltage. Fabrication of the double gate recess, however, adds additional steps to the manufacturing process thus increasing the complexity and cost of manufacturing the device.

It is known in the art that incorporating a greater proportion of In in the $Ga_{1-x}In_xAs$ channel layer improves the performance of the pHEMT. However, the amount of In that can be added to the channel layer is limited because an increased proportion of In causes a lattice strain buildup in the channel layer. Though the strain buildup of the channel layer can be compensated, it is difficult to use AlGaAs as a strain-compensating layer because AlGaAs is basically lattice-matched to the GaAs substrate.

Moreover, a high-resistivity, wide bandgap material is desirable to improve the pinch-off characteristics of the HEMT or pHEMT.

SUMMARY OF THE INVENTION

The present invention provides a material system and epitaxial structure for a field-effect transistor that allows it to incorporate $Al_{1-y}Ga_yP_{0.71+z}Sb_{0.29-z}$ in the barrier layer, thereby allowing the field-effect transistor to provide both low-noise and power capabilities.

In accordance with a preferred embodiment of the present invention, the novel material system, which results in a field-effect transistor on a semiconductive support made from a GaAs substrate, includes a channel layer made from undoped narrow-gap semiconductor of GaInAs, a donor layer made from doped wide-gap semiconductor of $Al_aGa_{1-a}As$ or $Al_{1-y}Ga_yP_{0.71+z}Sb_{0.29-z}$, and a barrier layer made from undoped semiconductor of $Al_{1-y}Ga_yP_{0.71+z}Sb_{0.29-z}$. Alternatively, the barrier layer may be made from a doped semiconductor of $Al_{1-y}Ga_yP_{0.71+z}Sb_{0.29-z}$, thus functioning as both the Schottky barrier and the donor layer. Preferably, the epitaxial structure includes both a barrier layer and a donor layer and further includes a spacer layer made from undoped wide-gap semiconductor of $Al_aGa_{1-a}As$ or $Al_{1-y}Ga_yP_{0.71+z}Sb_{0.29-z}$ between the channel and donor layers, a buffer layer made from undoped semiconductor of GaAs or $Al_{1-y}Ga_yP_{0.71+z}Sb_{0.29-z}$ between the support and the channel layer, and a cap layer made from a narrow-gap semiconductor including GaAs.

The present invention also encompasses a novel method of making a material system for a field-effect transistor. The method steps include providing a channel over a support, the channel made from undoped narrow-gap semiconductor material including GaInAs, and providing a barrier layer made from doped $Al_{1-y}Ga_yP_{0.71+z}Sb_{0.29-z}$. Preferably, a donor layer is provided between the barrier layer and the channel layer, the donor layer made from doped semiconductor material including $Al_aGa_{1-a}As$ or $Al_{1-y}Ga_yP_{0.71+z}Sb_{0.29-z}$, and the barrier layer remaining undoped. The method steps further include providing a dopant to the donor layer in a material system comprising a donor layer and a barrier layer, or to the barrier layer in a material system not comprising a donor layer. Most preferably, the method steps also include providing a buffer layer between the channel layer and the support, the buffer layer made from undoped semiconductor material including GaAs or $Al_{1-y}Ga_yP_{0.71+z}Sb_{0.29-z}$, providing a spacer layer between the channel layer and the donor layer, the spacer layer made from undoped semiconductor material including $Al_aGa_{1-a}As$ or $Al_{1-y}Ga_yP_{0.71+z}Sb_{0.29-z}$, and providing a cap layer comprising a narrow-gap semiconductor including GaAs.

The present invention further includes a material system having a buffer layer made from $Al_{1-y}Ga_yP_{0.71+z}Sb_{0.29-z}$. This construction provides improved low-noise and power performance of the GaAs HEMT or pHEMT system over conventional AlGaAs/GaInAs on a GaAs substrate.

Because $AlP_{0.71+y}Sb_{0.29-y}$ has a larger $\Delta Ec$ compared to a conventional AlGaAs/InGaAs system, the channel layer of the present invention has a larger sheet charge density, which results in field-effect transistor having higher current-carrying capabilities. In addition, the larger $\Delta Ec$ provides a higher transconductance and therefore higher cutoff frequencies compared to AlGaAs/GaInAs HEMTs of the same gate-length. This also results in a lower noise figure for the transistor.

Because $AlP_{0.71+y}Sb_{0.29-y}$ has a larger $\Delta Ev$ as compared to the conventional AlGaAs/InGaAs material system a field-effect transistor including a material system in accordance to the present invention has a much lower hole injection from the channel layer into the barrier layer and therefore much lower gate current. Furthermore, the wide bandgap of the $AlP_{0.71+z}Sb_{0.29-z}$ material implies that it could function as an effective etch stop layer for better and more uniform control of the pinch-off voltage and transconductance of transistors across a wafer. Additionally, the large bandgap allows the $AlP_{0.71+z}Sb_{0.29-z}$ material to function as a high-resistivity buffer layer.

Moreover, the epitaxial structure in accordance to the present invention provides a flexible framework for improvements through strain-compensation. The ability to add more indium to the channel layer, while at the same time adding more phosphorous to the AlGaPSb barrier layer, improves transport and breakdown/leakage characteristics and allows satisfaction of the growth requirement of a pseudomorphic structure. In addition, AlGaPSb is a chemically stable material which does not decompose when exposed to the atmosphere at the operating temperature of a device. In addition, the $AlP_{0.71+y}Sb_{0.29-y}$ material is expected to have less DX centers than high-Al AlGaAs.

The invention itself, together with further objects and attendant advantages, will best be understood by reference to the following detailed description, taken in conjunction with the accompanying drawings.

DESCRIPTION OF THE PREFERRED EMBODIMENTS

Figure 1:
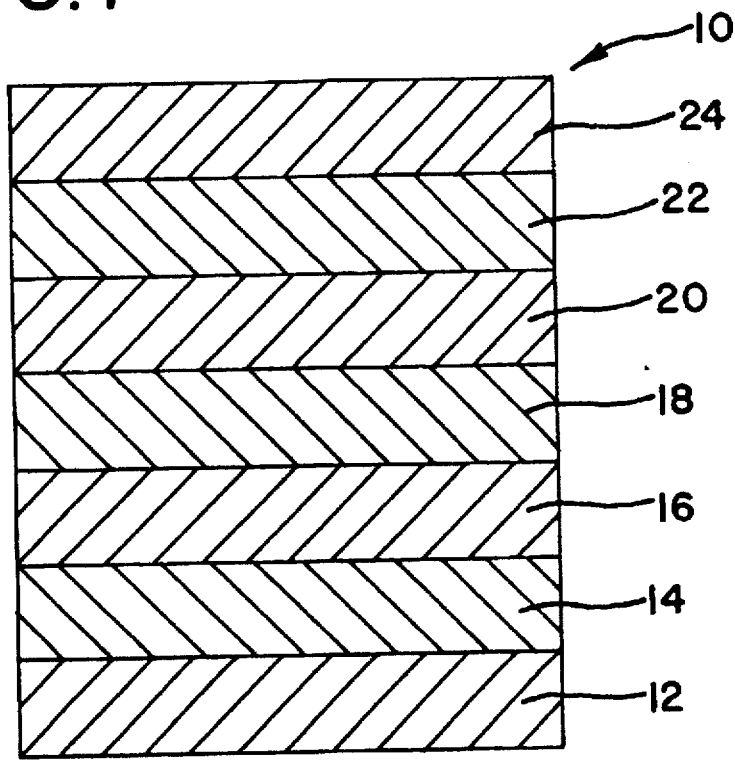
FIG. 1 is a schematic diagram of a cross-section of a field-effect transistor structure embodying the present invention.

The present invention is a material system and epitaxial structure which results in a more reliable, high frequency, low-noise and power HEMT or pHEMT. As shown in FIG. 1, an epitaxial structure 10 for a field-effect transistor in accordance with the present invention includes a semiconductive support 12, a buffer layer 14, a channel layer 16 made from GaInAs, a spacer layer 18, a donor layer 20, a barrier layer 22 made from aluminum gallium phosphorous antimony ($Al_{1-y}Ga_yP_{0.71+z}Sb_{0.29-z}$ or AlGaPSb) and a cap layer 24.

The semiconductive support 12 includes a substrate and/or a supporting layer including a semiconductor material.

For example, the semiconductive support 12 may be a substrate including GaAs or a supporting layer comprising GaAs.

The buffer layer 14 comprises any semiconductor material suitable for confining misfit dislocation of the semiconductive support 12 surface from the channel layer 16. For example, the buffer layer may comprise a material selected from the group consisting essentially of GaAs and $Al_{1-y}Ga_yP_{0.71+z}Sb_{0.29-z}$. The preferred buffer layer 14 comprises $Al_{1-y}Ga_yP_{0.71+z}Sb_{0.29-z}$.

The channel layer 16 comprises gallium indium arsenide in mole proportion represented by the formula $Ga_{1-x}In_xAs$. The preferred value of x is any number between about 0 and about 0.5. The more preferred value for x is any number between about 0.15 and about 0.35.

The spacer layer 18 and donor layer 20 comprise any wide-gap semiconductor material suitable for a spacer layer in a MODFET. For example, the spacer layer 18 may comprise a material selected from the group consisting essentially of $Al_aGa_{1-a}As$ and $Al_{1-y}Ga_yP_{0.71+z}Sb_{0.29-z}$. The preferred material is $Al_{1-y}Ga_yP_{0.71+z}Sb_{0.29-z}$.

The preferred value of a in the formula $Al_aGa_{1-a}As$ is any number between about 0.1 and about 0.5. The more preferred value of a is any number between about 0.15 and about 0.35. The preferred value of y in the formula $Al_{1-y}Ga_yP_{0.71+z}Sb_{0.29-z}$ is any number between about 0 and about 0.3. The more preferred value of y is any number between about 0 and about 0.1. The most preferred value of y is about 0. The preferred value of z in the formula $Al_{1-y}Ga_yP_{0.71+z}Sb_{0.29-z}$ may be any number between about −0.21 and 0.29. The more preferred value of z is between about −0.1 and about 0.1.

A preferred embodiment of the present invention is the epitaxial structure 10 shown in FIG. 1 which includes buffer 14, spacer 18, donor 20 and barrier 22 layers all comprising $Al_{1-y}Ga_yP_{0.71+z}Sb_{0.29-z}$.

As in a conventional MODFET, the epitaxial structure 10 shown in FIG. 1 may utilize the barrier layer 22 as both a Schottky barrier and a donor layer, thereby dispensing with the donor layer 20. In this embodiment, the barrier layer 22 further comprises a dopant. The dopant can be an N-type dopant for the $Al_{1-y}Ga_yP_{0.71+z}Sb_{0.29-z}$. For example, the dopant may be an element selected from the group consisting essentially of terrylium (Te) and group IV semiconducting elements from the periodic table. Thus, the dopant may be an element selected from the group consisting Te, silicon (Si), germanium (Ge) and tin (Sn). The preferred dopants are Te and Si.

A preferred embodiment of the present invention includes both a barrier layer 22 and a donor layer 20. When the epitaxial structure 10 includes the barrier layer 22 as well as the donor layer 20, the donor layer is doped while the barrier layer remains undoped. The dopant can be any N-type dopant for $Al_aGa_{1-a}As$ or $Al_{1-y}Ga_yP_{0.71+z}Sb_{0.29-z}$. For example, the dopant may be an element selected from the group consisting essentially of Te and group IV semiconducting elements from the periodic table. Thus, the dopant may be an element selected from the group consisting Te, Si, Ge and Sn. The preferred dopants are Te and Si.

The cap layer 24 may comprise any narrow-gap material suitable for facilitating a source and drain ohmic contact formation field-effect transistor. For example, the cap layer 24 may comprise GaAs. The cap layer 24 may be doped or undoped. Preferably, the cap layer is doped with a dopant. The preferred dopant is an N-type dopant suitable for doping the narrow-gap semiconductor material in the cap layer 24. For example, the dopant can be Si or Te.

The growth of the epilayers comprising $Al_{1-y}Ga_yP_{0.71+z}Sb_{0.29-z}$ can be achieved by an epitaxial growth techniques which supply sources of phosphorous and antimony. For example, the barrier layer 22 can be grown from a $PH_3$ gas source equipped with a solid-source antimony. Alternatively, the barrier layer 22 can be grown from an AlGaSb/AlP superlattice to mimic an $Al_{1-y}Ga_yP_{0.71+z}Sb_{0.29-z}$ material. When the desired material is $AlP_{0.71+z}Sb_{0.29-z}$, the barrier layer 22 can be grown from an AlP/AlSb superlattice to mimic an $AlP_{0.71+z}Sb_{0.29-z}$ epilayer.

For example, the barrier layer 22 comprising $AlP_{0.71}Sb_{0.29}$ can be grown in accordance with the superlattice growth method, comprising a superlattice with a period of about 30Å and a proper duty cycle, namely about 21.3Å AlP and about 8.7Å AlSb, which will mimic the electronic properties of $AlP_{0.71}Sb_{0.29}$. Preferably, the AlP/AlSb superlattice has a period measurement between about 15Å and about 50Å.

The more preferred method of growing the epilayers is growth of an $Al_{1-y}Ga_yP_{0.71+z}Sb_{0.29-z}$ epilayer from a phosphine ($PH_3$) gas source and solid-source of antimony. The flow of phosphine gas can be controlled with a mass flow controller. A thermal cracker at about 800° C. cracks phosphine gas into (mainly) dimers before incorporating into the growth front of the layers. As for the antimony, a well established approach is to generate tetramers and dimers of antimony by thermal means (in an effusion cell), in the same way arsenic is generated in a more conventional solid-source MBE growth chamber. High-quality antimonides (GaSb and AlSb) have been achieved worldwide with or without a thermal cracker. Yet, unlike the arsenic, antimony flux can be shuttered very abruptly. Thus, high quality, abrupt interfaces can be grown.

Conventional epitaxial growth processes can be used to make the epitaxial structure 10 of the present invention. The preferred processes include gas-source molecular beam epitaxy (GSMBE), chemical beam epitaxy (CBE) and metalorganic chemical vapor deposition (MOCVD), the latter process also known as metalorganic vapor phase epitaxy (MOVPE). The most preferred processes are GSMBE and CBE.

The epitaxial structure of the present invention provides a flexible framework for improvements through strain-compensation. More indium can be added to the channel layer while at the same time more phosphorous can be added to the AlGaPSb barrier layer of the epitaxial structure in accordance to the present invention. The channel layer is then under a biaxial compressive stress while the barrier is under a biaxial tensile stress. Thus, one can improve transport and breakdown/leakage characteristics while at the same time satisfy the growth requirement of a pseudomorphic structure. Such a scheme is un-available in the AlGaAs/GaInAs pHEMT system. In addition, AlGaPSb is a chemically stable material which does not decompose when exposed to the atmosphere at the operating temperature of a device. Typically, the operating temperature of a device is below about 250° C. Moreover, the $AlP_{0.71+y}Sb_{0.29-y}$ material is expected to have much less DX centers than high-Al AlGaAs.

Calculations were performed based on the self-consistent ab initio band structure methodology of Van de Walle's model solid approach (reference: C. G. Van de Walle, "Band lineups and deformation potentials in the model-solid theory", Physical Review B, Vol. 39, pages 1871–1881, January 1989) on the material system $AlP_{0.71}Sb_{0.29}$ and $Ga_{0.78}In_{0.22}As$. ($AlP_{0.71}Sb_{0.29}$ is lattice-matched to $Ga_{0.78}In_{0.22}As$ per Vegard's law.) Based on these calculation, a type I lineup can be expected between $AlP_{0.71}Sb_{0.29}$ and $Ga_{0.78}In_{0.22}As$.

Figure 2:
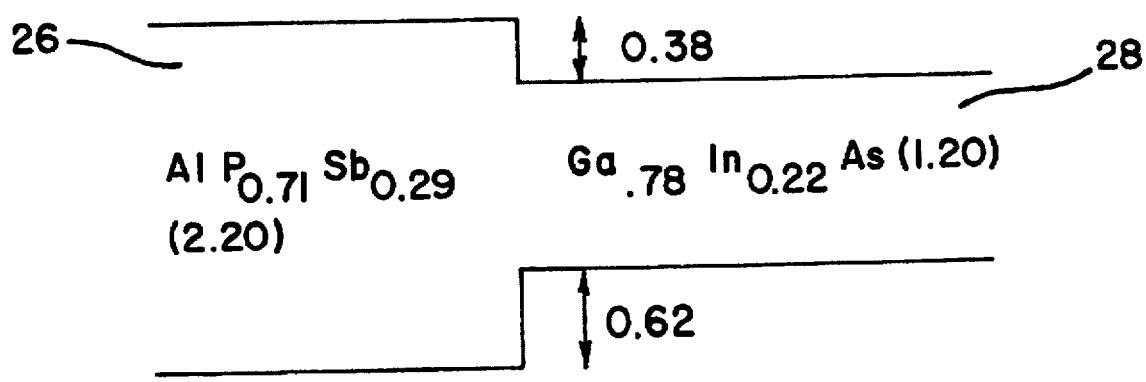
FIG. 2 is a schematic diagram of a bandgap lineup of a field-effect transistor structure embodying the present invention.

FIG. 2 shows the band lineup between between $AlP_{0.71}Sb_{0.29}$ and $Ga_{0.78}In_{0.22}As$ 28. As shown in FIG. 2, the material $AlP_{0.39}Sb_{0.61}$ 26 has a bandgap of about 2.20 eV, whereas the material $Ga_{0.78}In_{0.22}As$ 28 has a bandgap of about 1.20 eV. In particular, a conduction band discontinuity ($\Delta Ec$) of 0.38 eV and a large valence band discontinuity ($\Delta Ev$) of 0.62 eV is expected for $AlP_{0.71}Sb_{0.29}/In_{0.22}Ga_{0.78}As$ material system.

The larger $\Delta Ec$ of 0.38 eV as compared to 0.33 eV for a conventional $Al_{0.3}Ga_{0.7}As/In_{0.22}Ga_{0.78}As$ system translates into a larger sheet charge density in the channel layer resulting in higher current-carrying capabilities. The larger $\Delta Ec$ will also lead to higher transconductance and therefore higher cutoff frequencies compared to AlGaAs/GaInAs HEMTs of the same gate-length. This will also result in lower noise figure for the transistor.

In addition, the larger $\Delta Ev$ of 0.62 eV as compared to 0.27 eV for a conventional $Al_{0.3}Ga_{0.7}As/In_{0.22}Ga_{0.78}As$ material system results in a lower hole injection from the channel layer 16 into the barrier layer 22 and therefore lower gate current.

Furthermore, the wide bandgap of the $AlP_{0.71+z}Sb_{0.29-z}$ material implies that it could function as an effective Schottky barrier. A $AlP_{0.71+z}Sb_{0.29-z}$ barrier layer 22 as shown in FIG. 1 can be used as an etch stop layer for better and more uniform control of the pinch-off voltage and transconductance of transistors across a wafer. Additionally, the large bandgap allows the $AlP_{0.71+z}Sb_{0.29-z}$ material to function as an excellent candidate for a high-resistivity buffer layer.

Therefore, the material $Al_{1-y}Ga_yP_{0.71+z}Sb_{0.29-z}$ is an excellent candidate for improving the low-noise and power performance of the GaAs HEMT or pHEMT system over conventional AlGaAs/GaInAs on the GaAs substrates.

Of course, it should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. A method of making an epitaxial structure for a field-effect transistor, the steps comprising:

providing a channel layer over a semiconductive support, said channel layer comprising a first narrow-gap semiconductor material; and providing a barrier layer over the channel layer, said barrier layer comprising a first wide-gap semiconductor material comprising $Al_{1-y}Ga_yP_{0.71+z}Sb_{0.29-z}$, wherein y has a value between about 0 to about 0.3 and z has a value between about −0.21 and about 0.29.

2. The method of claim 1 wherein y has a value between about 0 and about 0.1 and z has a value between about −0.1 and about 0.1.

3. The method of claim 1 wherein y has a value of about 0.

4. The method of claim 1 wherein said first narrow-gap semiconductor material comprises $Ga_{1-x}In_xAs$, wherein x has a value between about 0 to about 0.5.

5. The method of claim 4 wherein x has a value between about 0.15 and about 0.35.

6. The method of claim 1 further comprising the step of providing a buffer layer comprising a semiconductor material between the channel layer and the semiconductive support.

7. The method of claim 6 wherein said semiconductor material comprises a compound selected from the group consisting of GaAs and $Al_{1-y}Ga_yP_{0.71+z}Sb_{0.29-z}$, wherein y has a value between about 0 to about 0.3 and z has a value between about −0.21 and about 0.29.

8. The method of claim 7 wherein y has a value between about 0 to about 0.1 and z has a value between about −0.1 and about 0.1.

9. The method of claim 1 further comprising the step of providing a donor layer between the barrier layer and the channel layer, said donor layer comprising a second wide-gap semiconductor material.

10. The method of claim 9 wherein said second wide-gap semiconductor material comprises a compound selected from the group consisting of $Al_aGa_{1-a}As$ and $Al_{1-y}Ga_yP_{0.71+z}Sb_{0.29-z}$, wherein y has a value between about 0 to about 0.3 and z has a value between about −0.21 and about 0.29.

11. The method of claim 9 wherein a has a value between about 0.1 and about 0.5.

12. The method of claim 9 wherein y has a value between about 0 and about 0.1 and z has a value between about −0.1 and about 0.1.

13. The method of claim 1 further comprising the step of providing a spacer layer between the barrier layer and the channel layer, said spacer layer comprising a third wide-gap semiconductor material.

14. The method of claim 13 wherein said third wide-gap semiconductor material comprises a compound selected from the group consisting of $Al_aGa_{1-a}As$ and $Al_{1-y}Ga_yP_{0.71+z}Sb_{0.29-z}$, wherein a has a value between about 0.1 and about 0.5, y has a value between about 0 to about 0.3 and z has a value between about −0.21 and about 0.29.

15. The method of claim 14 wherein y has a value between about 0 and about 0.1 and z has a value between about −0.1 and about 0.1.

16. The method of claim 1 wherein said semiconductive support comprises a GaAs substrate.

17. The method of claim 1 wherein:
said channel layer is provided over said semiconductive support by growing said channel layer over said semiconductive support in a growth chamber;
said barrier layer is provided over said channel layer by growing said barrier layer over said channel layer in said growth chamber.

18. The method of claim 17 wherein said growth chamber is adapted for growth of epitaxial $Al_{1-y}Ga_yPSb$ from an $Al_{1-y}Ga_ySb/AlP$ superlattice.

19. The method of claim 17 wherein said growth chamber is adapted for growth of films from a phosphine gas source and a solid-source antimony.

20. The method of claim 1 further comprising the step of providing a cap layer over the barrier layer, said cap layer comprising a second narrow-gap semiconductor material.

21. The method of claim 1 wherein said second narrow-gap semiconductor material is GaAs.

22. An epitaxial structure for a field-effect transistor comprising:

a channel layer over a semiconductive support, said channel layer comprising a first narrow-gap semiconductor material; and a barrier layer over the channel layer, said barrier layer comprising a first wide-gap semiconductor material comprising $Al_{1-y}Ga_yP_{0.71+z}Sb_{0.29-z}$, wherein y has a value between about 0 to about 0.3 and z has a value between about −0.21 and about 0.29.

23. The epitaxial structure of claim 22 wherein said semiconductive support comprises a GaAs substrate.

24. The epitaxial structure of claim 23, further comprising:

a buffer layer between the semiconductive support and the channel layer, said buffer layer comprising a semiconductor material;

a cap layer over the barrier layer, said cap layer comprising a second narrow-gap semiconductor material.

25. The epitaxial structure of claim 24 wherein:
said first narrow-gap semiconductor material comprises $Ga_{1-x}In_xAs$;

said semiconductor material comprises a compound selected from the group consisting of GaAs and $Al_{1-y}Ga_yP_{0.71+z}Sb_{0.29-z}$, wherein y has a value between about 0 and 0.1 and z has a value between about −0.1 and 0.1; and said second narrow-gap semiconductor material comprises GaAs.

26. The epitaxial structure of claim 25 further comprising a donor layer between the channel layer and the barrier layer, said donor layer comprising a second wide-gap semiconductor material.

27. The epitaxial structure of claim 26 further comprising a spacer layer between the channel layer and the donor layer, said spacer layer comprising a third wide-gap semiconductor material.

28. The epitaxial structure of claim 27 wherein:
said second wide-gap semiconductor material and said third wide-gap semiconductor material are selected from the group consisting of $Al_aGa_{1-a}As$ and $Al_{1-y}Ga_yP_{0.71+z}Sb_{0.29-z}$, wherein y has a value between about 0 and 0.1 and z has a value between about −0.1 and 0.1.

29. The epitaxial structure of claim 28 wherein said second wide-gap semiconductor material and said third wide-gap semiconductor material are $Al_{1-y}Ga_yP_{0.71+z}Sb_{0.29-z}$, wherein y has a value between about 0 and 0.1 and z has a value between about −0.1 and 0.1.

30. The epitaxial structure of claim 29 wherein:
x has a value between about 0 to about 0.5;
a has a value between about 0.1 and about 0.5.

31. The epitaxial structure of claim 29 wherein y has a value between about 0 and 0.1 and z has a value between about −0.1 and 0.1.

32. The epitaxial structure of claim 29 wherein y has a value of about 0.

* * * * *